United States Patent
Bi et al.

(10) Patent No.: US 11,011,674 B2
(45) Date of Patent: May 18, 2021

(54) MULTI-LAYERED TUNNEL JUNCTION STRUCTURE, LIGHT EMITTING DEVICE HAVING THE SAME, AND PRODUCTION METHOD OF SUCH DEVICE

(71) Applicant: XIAMEN SAN'AN OPTOELECTRONICS CO., LTD., Xiamen (CN)

(72) Inventors: Jingfeng Bi, Tianjin (CN); Chaoyu Wu, Xiamen (CN); Duxiang Wang, Tianjin (CN); Senlin Li, Tianjin (CN); Chun-Yi Wu, Tianjin (CN); Shih-Yi Lien, Tianjin (CN)

(73) Assignee: Xiamen San'an Optoelectronics Co., Ltd., Fujian (CN)

( * ) Notice: Subject to any disclaimer, the term of this patent is extended or adjusted under 35 U.S.C. 154(b) by 0 days.

(21) Appl. No.: 16/711,721

(22) Filed: Dec. 12, 2019

(65) Prior Publication Data

US 2020/0119224 A1    Apr. 16, 2020

Related U.S. Application Data

(63) Continuation-in-part of application No. PCT/CN2018/081671, filed on Apr. 3, 2018.

(30) Foreign Application Priority Data

Jul. 25, 2017    (CN) .......................... 201710610318.5

(51) Int. Cl.
| | |
|---|---|
| *H01L 33/06* | (2010.01) |
| *H01L 33/00* | (2010.01) |
| *H01L 33/08* | (2010.01) |
| *H01L 33/14* | (2010.01) |
| *H01L 33/30* | (2010.01) |

(52) U.S. Cl.
CPC .......... *H01L 33/06* (2013.01); *H01L 33/0062* (2013.01); *H01L 33/08* (2013.01); *H01L 33/14* (2013.01); *H01L 33/30* (2013.01)

(58) Field of Classification Search
CPC ..... H01L 33/0062; H01L 33/06; H01L 33/14; H01L 33/04; H01L 33/08; H01L 33/30; H01L 33/025; H01L 33/001611
See application file for complete search history.

(56) References Cited

FOREIGN PATENT DOCUMENTS

| | | |
|---|---|---|
| CN | 1917241 B | 10/2010 |
| CN | 105977349 A | 9/2016 |
| CN | 107482091 A | 12/2017 |

*Primary Examiner* — Savitri Mulpuri
(74) *Attorney, Agent, or Firm* — Rosenberg, Klein & Lee

(57) ABSTRACT

A multi-layered tunnel junction structure adapted to be disposed between two light emitting structures includes an n-type doped insulation layer, as well as an n-type heavily doped layer, a metal atom layer, a p-type heavily doped layer, and a p-type doped insulation layer which are disposed on the n-type doped insulation layer in such sequential order. A light emitting device having the multi-layered tunnel junction structure and a production method of such light emitting device are also disclosed.

16 Claims, 2 Drawing Sheets

MULTI-LAYERED TUNNEL JUNCTION STRUCTURE, LIGHT EMITTING DEVICE HAVING THE SAME, AND PRODUCTION METHOD OF SUCH DEVICE

CROSS-REFERENCE TO RELATED APPLICATION

This application is a bypass continuation-in-part application of International Application No. PCT/CN2018/081671 filed on Apr. 3, 2018, which claims priority of Chinese Patent Application No. 201710610318.5, filed on Jul. 25, 2017. The entire content of each of the international and Chinese patent applications is incorporated herein by reference.

FIELD

The disclosure relates to a multi-layered tunnel junction structure, a light emitting device having the same, and a method for producing the light emitting device.

BACKGROUND

Application of facial and iris recognition to mobile devices has been prevailing. It is expected that 2 billions of mobile devices equipped with a recognition component having an infrared light emitting diode (LED) will be reached in 2020. Therefore, the production value of facial and iris recognition components having infrared LEDs will reach 250 million USD at the time, rendering infrared LEDs promising. Commercial iris recognition components generally employ infrared LEDs (700 nm to 900 nm) to assist cameras in capturing images of iris with a desired depth of field and intended three-dimensionality.

The aforesaid iris recognition components are required to have infrared LEDs with a satisfactory lighting power. To this end, muti-junction LEDs are connected in series. Specifically, during epitaxial growth, LED components are connected in series by virtue of tunnel junction structures. The tunnel junction structures formed through epitaxial growth have a high peak current density and the following characteristics. The tunnel junction structures should be satisfactorily thin and highly doped to be in ohmic contact which causes no voltage drop, and are characterized as follows. First, two sides of the p-n junction have a sufficiently high doping concentration (about $10^{19}$ cm$^{-3}$), so that a degenerate semiconductor is provided. Secondly, the distribution of the impurity concentration of the p-n junction should be as steep as possible so as to prevent impurity interdiffusion which leads to impurity compensation. Thirdly, the thickness of the p-type and n-type zones of the tunnel junction structures should be as small as possible (less than 15 nm).

In order to achieve a sufficiently high peak tunneling current, the material selection, dopant selection, doping concentration, and growth manner for the tunnel junction should be taken into consideration. Furthermore, during the subsequent growth process, dopant memory effect and diffusion (or other action) of doped impurities should be prevented from adversely affecting the quality of the p-n junction, thereby maintaining the quality of the component.

The diode current can be calculated using the following equation (I):

$$I_{diode}=I_{do} \times (\exp(V/(\eta \times V_t))-1) \quad (I)$$

where $I_{do}$ is the reverse saturation current and will be very high in the tunnel diode compared to in the PN junction diode due to high doping concentrations, V is the voltage applied across the diode, $V_t$ is the voltage equivalent of temperature, and η is the correction factor. Due to the parasitic tunneling via impurities, the excess current will be developed and is an additional current by which the valley point can be determined. Moreover, the tunneling current can be calculated using the following equation (II):

$$I_{tun}=(V/R_0) \times \exp(-(V/V_0)^m) \quad (II)$$

where V is the voltage applied across the diode, $V_0$ ranges from 0.1 to 0.5 volts, m ranges from 1 to 3, and $R_0$ is the tunnel diode resistance.

Furthermore, it can be observed that the peak tunneling current is most relevant to the doping concentration, and is also relevant to the bang gap of the material for the tunnel junction. Specifically, the higher the doping concentration, the larger the peak tunneling current is. The smaller the band gap of the material for the tunnel junction, the larger the peak tunneling current is. For instance, when GaInAs, which has a relatively low band gap, is used to prepare a tunnel junction having a size of 4 inches, such tunnel junction has a peak tunneling current density ($J_{peak}$) larger than 1 kA/cm$^2$.

Regarding the practical application of muti-junction LEDs, with increasing demand of large size products having a satisfactory lighting power (for example, vehicle lamps, stage lights, iris recognition components, etc.), the injection current is required to be larger, and the peak tunneling current density of the tunnel junction is required to be more satisfactory (e.g. $J_{peak}$ is required to be larger than 100 A/cm$^2$). However, since the tunnel junction having a small band gap might absorb light, the lighting power of the lighting device having such tunnel junction might be adversely affected. Thus, reducing the band gap of semiconductor materials for tunnel junctions is an unsatisfactory way to enhance the peak current density.

SUMMARY

Therefore, an object of the disclosure is to provide a multi-layered tunnel junction structure, a light emitting device, and a production method of a light emitting device which can alleviate at least one of the drawbacks of the prior art.

The multi-layered tunnel junction structure is adapted to be disposed between two light emitting structures. The multi-layered tunnel junction structure includes an n-type doped insulation layer, an n-type heavily doped layer, a metal atom layer, a p-type heavily doped layer, and a p-type doped insulation layer. The n-type heavily doped layer is disposed on the n-type doped insulation layer and is higher in doping concentration than the n-type doped insulation layer. The metal atom layer is disposed on the n-type heavily doped layer opposite to the n-type doped insulation layer. The p-type heavily doped layer is disposed on the metal atom layer opposite to the n-type heavily doped layer. The p-type doped insulation layer is disposed on the p-type heavily doped layer opposite to the metal atom layer. The p-type heavily doped layer is higher in doping concentration than the p-type doped insulation layer. Each of the n-type doped insulation layer and the p-type doped insulation layer has a doping concentration ranging from $5 \times 10^{17}$ cm$^{-3}$ to $5 \times 10^{18}$ cm$^{-3}$.

The light emitting device includes a first light emitting structure, a second light emitting structure, and a multi-layered tunnel junction structure as described above. The first light emitting structure includes a first n-type layer, a first active layer disposed on the first n-type layer, and a first p-type layer disposed on the first active layer opposite to the first n-type layer. The second light emitting structure includes a second n-type layer, a second active layer disposed on the second n-type layer, and a second p-type layer disposed on the second active layer opposite to the second n-type layer. The multi-layered tunnel junction structure is disposed between the first light emitting structure and the second light emitting structure. An n-type doped insulation layer of the multi-layered tunnel junction structure is disposed adjacent to the first p-type layer of the first light emitting structure. A p-type doped insulation layer of the multi-layered tunnel junction structure is disposed adjacent to the second n-type layer of the second light emitting structure.

The method for producing a light emitting device includes forming a first light emitting structure, forming a multi-layered tunnel junction structure as described above on the first light emitting structure, and forming a second light emitting structure on the multi-layered tunnel junction structure opposite to the first light emitting structure. The first light emitting structure includes a first n-type layer, a first active layer disposed on the first n-type layer, and a first p-type layer disposed on the first active layer opposite to the first n-type layer. The second light emitting structure includes a second n-type layer, a second active layer disposed on the second n-type layer, and a second p-type layer disposed on the second active layer opposite to the second n-type layer. An n-type doped insulation layer of the multi-layered tunnel junction structure is disposed adjacent to the first p-type layer of the first light emitting structure. A p-type doped insulation layer of the multi-layered tunnel junction structure is disposed adjacent to the second n-type layer of the second light emitting structure.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
FIG. 1 is a schematic view illustrating a first embodiment of a light emitting device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be emphasized that, in accordance with the standard practice in the industry, various features or elements are not drawn to scale. In fact, the dimensions of the various features or elements may be arbitrarily increased or reduced for clarity of discussion.

Referring to FIG. 1, a first embodiment of a light emitting device according to the present disclosure is a double-junction light emitting device, and includes a first light emitting structure (LES-I), a second light emitting structure (LES-II), and a multi-layered tunnel junction structure 1. In this embodiment, the light emitting device is a AlGaInP-based light emitting device.

The first light emitting structure (LES-I) includes a first n-type layer 3, a first active layer 4 disposed on the first n-type layer 3, and a first p-type layer 5 disposed on the first active layer 4 opposite to the first n-type layer 3.

In this embodiment, the first n-type layer 3 includes an n-type GaAs-based ohmic contact layer, an n-type AlInP-based cladding layer, and a non-doped AlGaInP-based layer serving as a spacing layer. The n-type GaAs-based ohmic contact layer has a doping concentration larger than $1 \times 10^{18}$ $cm^{-3}$. The n-type AlInP-based cladding layer has a thickness of 50 nm to 1000 nm and a doping concentration ranging from $5 \times 10^{17}$ $cm^{-3}$ to $5 \times 10^{18}$ $cm^{-3}$. The first active layer 4 has a multiple-quantum-well structure which has a peak emission wavelength of 810 nm, and which is composed of AlInGaAs and AlGaAs for respectively serving as quantum-wells and barriers. Such multiple-quantum-well structure has 12 periods and a total thickness ranging from 400 nm to 500 nm. The first p-type layer 5 includes a p-type AlInP-based cladding layer and a non-doped AlGaInP-based layer serving as a spacing layer.

The second light emitting structure (LES-II) includes a second n-type layer 6, a second active layer 7 disposed on the second n-type layer 6, and a second p-type layer 8 disposed on the second active layer 7 opposite to the second n-type layer 6.

In this embodiment, the second n-type layer 6 includes an n-type AlInP-based cladding layer and a non-doped AlGaInP-based layer serving as a spacing layer. The second active layer 7 has a multiple-quantum-well structure which has a peak emission wavelength of 810 nm, and which is composed of AlInGaAs and AlGaAs for respectively serving as quantum-wells and barriers. Such multiple-quantum-well structure has 12 periods and a total thickness ranging from 400 nm to 500 nm. The second p-type layer 8 includes a p-type GaAs-based ohmic contact layer, a p-type AlInP-based cladding layer, and a non-doped AlGaInP-based layer serving as a spacing layer.

The first and second light emitting structures (LES-I, LES-II) may each further include an etch-stop layer and/or a transparent electrically conductive layer when needed.

The multi-layered tunnel junction structure 1 is disposed between the first light emitting structure (LES-I) and the second light emitting structure (LES-II).

In this embodiment, the light emitting device further includes a substrate 2 on which the first light emitting structure (LES-I) is formed. The substrate 2 is a GaAs-based growth substrate that is n-type doped and that has a deviation angle of 2° on crystal plane (111). The substrate 2 has a thickness of about 350 μm and a doping concentration ranging from $1 \times 10^{18}$ $cm^{-3}$ to $4 \times 10^{18}$ $cm^{-3}$.

Figure 2:
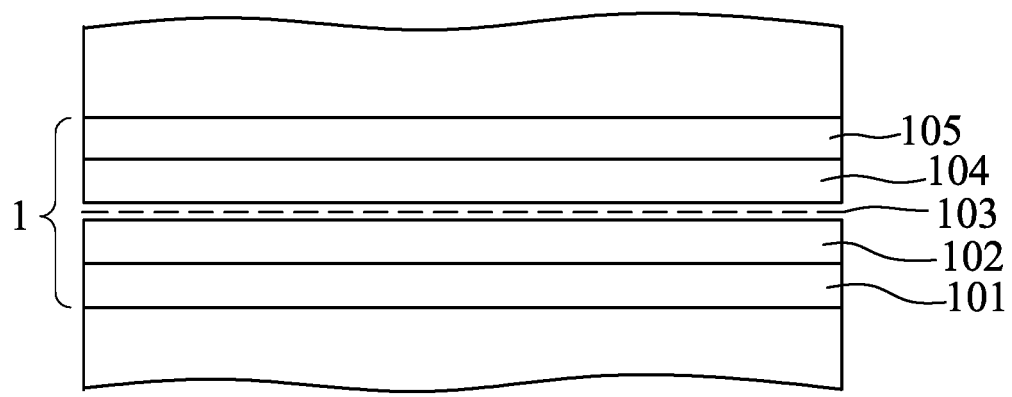
FIG. 2 is a fragmentary, enlarged schematic view illustrating a multi-layered tunnel junction structure of the first embodiment.

Referring to FIG. 2, the multi-layered tunnel junction structure 1 includes an n-type doped insulation layer 101, an n-type heavily doped layer 102, a metal atom layer 103, a p-type heavily doped layer 104, and a p-type doped insulation layer 105.

The n-type doped insulation layer 101 of the multi-layered tunnel junction structure 1 is disposed adjacent to the first p-type layer 5 of the first light emitting structure (LES-I), and the p-type doped insulation layer 105 of the multi-layered tunnel junction structure 1 is disposed adjacent to the second n-type layer 6 of the second light emitting structure (LES-II).

The n-type heavily doped layer 102 is disposed on the n-type doped insulation layer 101, and is higher in doping concentration than the n-type doped insulation layer 101. The metal atom layer 103 is disposed on the n-type heavily doped layer 102 opposite to the n-type doped insulation layer 101. The p-type heavily doped layer 104 is disposed on the metal atom layer 103 opposite to the n-type heavily doped layer 102. The p-type doped insulation layer 105 is disposed on the p-type heavily doped layer 104 opposite to the metal atom layer 103. The p-type heavily doped layer 104 is higher in doping concentration than the p-type doped insulation layer 105.

The p-type heavily doped layer 104 has a first band gap larger than band gaps of the first and second light emitting structures (LES-I, LES-II). The n-type heavily doped layer 102 has a second band gap larger than the band gaps of the first and second light emitting structures (LES-I, LES-II). The p-type doped insulation layer 105 has a third band gap larger than the first band gap. The n-type doped insulation layer 101 has a fourth band gap larger than the second band gap.

The thickness and doping regarding the n-type heavily doped layer 102 and the p-type heavily doped layer 104 may be adjusted to optimize the depletion thickness of the p-n junction, and to secure the tunneling effect and the peak current density of the tunnel junction. The p-type heavily doped layer 104 may have a thickness ranging from 5 nm to 20 nm and a doping concentration larger than $1 \times 10^{20}$ cm$^{-3}$, and the n-type heavily doped layer 102 may have a thickness ranging from 5 nm to 20 nm and a doping concentration larger than $2 \times 10^{19}$ cm$^{-3}$.

The n-type doped insulation layer 101 and the p-type doped insulation layer 105 may be configured to be barrier layers for respectively preventing impurities in the n-type heavily doped layer 102 and the p-type heavily doped layer 104 from diffusion and recombination (i.e. the Auger effect). When serving as such barrier layers, the n-type doped insulation layer 101 and the p-type doped insulation layer 105 do not adversely affect the series resistance of all the components. The p-type doped insulation layer 105 may have a doping concentration ranging from $8 \times 10^{17}$ cm$^{-3}$ to $5 \times 10^{18}$ cm$^{-3}$, and the n-type doped insulation layer 101 may have a doping concentration ranging from $8 \times 10^{17}$ cm$^{-3}$ to $5 \times 10^{18}$ cm$^{-3}$.

In this embodiment, the n-type doped insulation layer 101 is carbon-doped AlGaInP (AlGaInP:C)-based, and has a doping concentration of $2 \times 10^{18}$ cm$^{-3}$, a thickness of 120 nm, and a band gap of 2.1 eV. In this embodiment, the n-type heavily doped layer 102 is Te-doped AlGaAs (AlGaAs:Te)-based. In this embodiment, the n-type heavily doped layer 102 has a thickness ranging from 5 to 40 nm (for example, 15 nm), a doping concentration of $5 \times 10^{19}$ cm$^{-3}$, and a band gap of 1.7 eV. In this embodiment, the p-type heavily doped layer 104 is carbon-doped AlGaAs (AlGaAs:C)-based. In this embodiment, the p-type heavily doped layer 104 has a thickness ranging from 5 to 40 nm (for example, 15 nm), a doping concentration of $2.5 \times 10^{20}$ cm$^{-3}$, and a band gap of 1.7 eV. In this embodiment, the p-type doped insulation layer 105 is Si-doped AlGaInP (AlGaInP:Si)-based, and has a doping concentration ranging from $5 \times 10^{17}$ cm$^{-3}$ to $5 \times 10^{18}$ cm$^{-3}$ (for example, $8 \times 10^{17}$ cm$^{-3}$), a thickness of 120 nm, and a band gap of 2.1 eV.

The metal atom layer 103 may contain metal atoms obtainable through thermal decompositition (for instance, through thermal decomposition during metal organic chemical vapor deposition (MOCVD) for growth). Examples of the metal atoms include, but are limited to, Ga, In, Al, and Sb. In this embodiment, the metal atom layer 103 contains Ga. The metal atom layer 103 serves to facilitate the tunneling effect via the metal electrical conductivity. The metal atom layer 103 may be a combination of a monolayer of metal atoms and a bilayer of metal atoms. Furthermore, the metal atom layer 103 may have lattice strain to an extent where no lattice mismatch occurs. The metal atom layer 103 is able to effectively reduce the light shielding effect, and hence does not adversely affect the lighting power of the components. In addition, the metal atom layer 103 is able to effectively reduce the series resistance, and therefore is capable of improving the power-to-light conversion efficiency.

Figure 3:
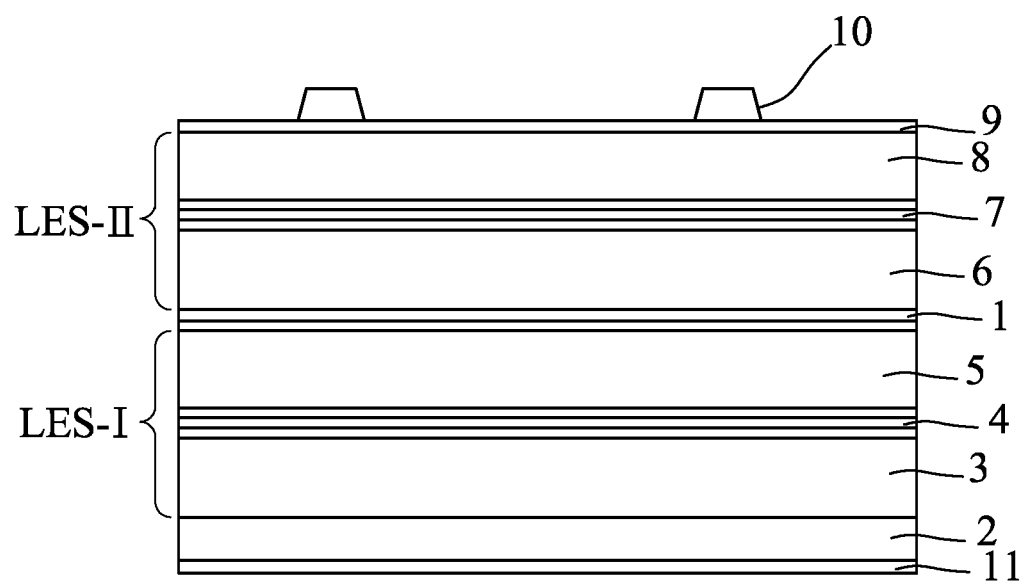
FIG. 3 is a schematic view illustrating that the first embodiment further includes an optical mask, a front electrode, and a back electrode.

Referring to FIG. 3, in this embodiment, the light emitting device further includes an optical mask 9, a front electrode 10, and a back electrode 11. The optical mask 9 is disposed on the second p-type layer 8 opposite to the second active layer 7. The front electrode 10 is disposed on the optical mask 9 opposite to the second p-type layer 8. The back electrode 11 is disposed on the substrate 2 opposite to the first light emitting structure (LES-I).

In this embodiment, the light emitting device, which is a double-junction light emitting device, emits light with a wavelength of 810 nm. The size of the light emitting device and the pattern of the electrodes may be varied according to the actual need.

The following two light emitting devices of 30 mil were respectively taken as an example and a comparative example: a light emitting device which had the overall structure as described above, i.e. included the metal atom layer 103 (the example); and a light emitting device which generally had the overall structure as described except the metal atom layer 103 (the comparative example). When such two light emitting devices were each provided with a testing current of 350 mA for determination of properties, the difference in the forward voltage (Vf) was about 1% to 1.5%, and the difference in the lighting power was about 2% to 3% (to be exact, the example had a stronger lighting power than the comparative example).

A method for producing the first embodiment of the light emitting device is described as follows.

The method includes forming the first light emitting structure (LES-I), forming the multi-layered tunnel junction structure 1 on the first light emitting structure (LES-I), and forming the second light emitting structure (LES-II) on the multi-layered tunnel junction structure 1 opposite to the first light emitting structure (LES-I).

The first and second light emitting structures (LES-I, LES-II) are epitaxially grown by virtue of metal organic chemical vapor deposition (MOCVD). The first light emitting structure (LES-I) is grown on the substrate 2.

During the formation of the multi-layered tunnel junction structure 1, the n-type doped insulation layer 101 and the n-type heavily doped layer 102 are epitaxially grown by virtue of MOCVD. Subsequently, the MOCVD source is turned off, and the metal atom layer 103 is epitaxially grown at a low growth rate (for instance, 15 A/sec) using trimethylgallium through $H_2$ purge. After the formation of the metal atom layer 103, the MOCVD source is turned back on, and the p-type heavily doped layer 104 and the p-type doped insulation layer 105 are epitaxially grown by virtue of MOCVD.

The optical mask 9, the front electrode 10, and the back electrode 11 are formed by virtue of deposition.

A second embodiment of the light emitting device according to the present disclosure is similar to the first embodiment of the light emitting device, except for the following differences.

In the second embodiment, the first n-type layer 3 of the first light emitting structure (LES-I) includes, in addition to the n-type GaAs-based ohmic contact layer, an n-type AlGaAs-based cladding layer and a non-doped AlGaAs-based layer instead. The non-doped AlGaAs-based layer serves as a spacing layer. The n-type GaAs-based ohmic contact layer has a thickness of 200 nm and a doping concentration of $1\times10^{18}$ cm$^{-3}$. The n-type AlGaAs-based cladding layer has a thickness of 500 nm and a doping concentration ranging from $2\times10^{18}$ cm$^3$ to $5\times10^{18}$ cm$^{-3}$.

In the second embodiment, the first active layer 4 of the first light emitting structure (LES-I) has a multiple-quantum-well structure which has a peak emission wavelength of 940 nm, and which is composed of InGaAs and AlGaAs for respectively serving as quantum-wells and barriers. Such multiple-quantum-well structure has 6 periods and a total thickness ranging from 200 nm to 250 nm.

In the second embodiment, the first p-type layer 5 of the first light emitting structure (LES-I) includes, instead, a p-type AlGaAs-based cladding layer and a non-doped AlGaAs-based layer serving as a spacing layer for the p-type zone. The p-type AlGaAs-based cladding layer has a thickness of 400 nm and a doping concentration ranging from $4\times10^{17}$ cm$^{-3}$ to $1\times10^{18}$ cm$^{-3}$.

In the second embodiment, the second n-type layer 6 of the second light emitting structure (LES-II) includes, instead, an n-type GaAs-based ohmic contact layer, an n-type AlGaAs-based cladding layer, and a non-doped AlGaAs-based layer serving as a spacing layer. The n-type GaAs-based ohmic contact layer has a thickness of 200 nm and a doping concentration of $1\times10^{18}$ cm$^{-3}$. The n-type AlGaAs-based cladding layer has a thickness of 500 nm and a doping concentration ranging from $2\times10^{18}$ cm$^{-3}$ to $5\times10^{18}$ cm$^{-3}$.

In the second embodiment, the second active layer 7 of the second light emitting structure (LES-II) has a multiple-quantum-well structure which has a peak emission wavelength of 940 nm, and which is composed of InGaAs and AlGaAs for respectively serving as quantum-wells and barriers. Such multiple-quantum-well structure has 6 periods and a total thickness ranging from 200 nm to 250 nm.

In the second embodiment, the second p-type layer 8 of the second light emitting structure (LES-II) includes, in addition to the p-type GaAs-based ohmic contact layer, a p-type AlGaAs-based cladding layer and a non-doped AlGaAs-based layer serving as a spacing layer for the p-type zone instead. The p-type AlGaAs-based cladding layer has a thickness of 400 nm and a doping concentration ranging from $4\times10^{17}$ cm$^{-3}$ to $1\times10^{18}$ cm$^{-3}$. The p-type GaAs-based ohmic contact layer has a thickness of 200 nm and a doping concentration of $5\times10^{18}$ cm$^{-3}$.

In the second embodiment, the light emitting device, which is a double-junction light emitting device, emits light with a wavelength of 940 nm.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A multi-layered tunnel junction structure adapted to be disposed between two light emitting structures, said multi-layered tunnel junction structure comprising:

an n-type doped insulation layer;

an n-type heavily doped layer disposed on said n-type doped insulation layer and higher in doping concentration than said n-type doped insulation layer;

a metal atom layer disposed on said n-type heavily doped layer opposite to said n-type doped insulation layer;

a p-type heavily doped layer disposed on said metal atom layer opposite to said n-type heavily doped layer; and a p-type doped insulation layer disposed on said p-type heavily doped layer opposite to said metal atom layer, said p-type heavily doped layer being higher in doping concentration than said p-type doped insulation layer, wherein each of said n-type doped insulation layer and said p-type doped insulation layer having a doping concentration ranging from $5\times10^{17}$ cm$^{-3}$ to $5\times10^{18}$ cm$^{-3}$.

2. The multi-layered tunnel junction structure as claimed in claim 1, wherein said p-type heavily doped layer has a first band gap larger than band gaps of the light emitting structures, said n-type heavily doped layer having a second band gap larger than the band gaps of the light emitting structures, said p-type doped insulation layer having a third band gap larger than said first band gap, said n-type doped insulation layer having a fourth band gap larger than said second band gap.

3. The multi-layered tunnel junction structure as claimed in claim 1, wherein each of said n-type heavily doped layer and said p-type heavily doped layer has a doping concentration larger than $1\times10^{19}$ cm$^{-3}$.

4. The multi-layered tunnel junction structure as claimed in claim 1, wherein said p-type heavily doped layer has a thickness ranging from 5 nm to 20 nm and a doping concentration larger than $1\times10^{20}$ cm$^{-3}$.

5. The multi-layered tunnel junction structure as claimed in claim 1, wherein said n-type heavily doped layer has a thickness ranging from 5 nm to 20 nm and a doping concentration larger than $2\times10^{19}$ cm$^{-3}$.

6. The multi-layered tunnel junction structure as claimed in claim 1, wherein said p-type doped insulation layer has a doping concentration ranging from $8\times10^{17}$ cm$^{-3}$ to $5\times10^{18}$ cm$^{-3}$.

7. The multi-layered tunnel junction structure as claimed in claim 1, wherein said n-type doped insulation layer has a doping concentration ranging from $8\times10^{17}$ cm$^{-3}$ to $5\times10^{18}$ cm$^{-3}$.

8. The multi-layered tunnel junction structure as claimed in claim 1, wherein said n-type doped insulation layer and said p-type doped insulation layer are configured to be barrier layers for respectively preventing impurities in said n-type heavily doped layer and said p-type heavily doped layer from diffusion and recombination.

9. The multi-layered tunnel junction structure as claimed in claim 1, wherein said metal atom layer contains metal atoms obtainable through thermal decomposition.

10. The multi-layered tunnel junction structure as claimed in claim 1, wherein said metal atom layer is a combination of a monolayer of metal atoms and a bilayer of metal atoms, said metal atom layer having lattice strain.

11. The multi-layered tunnel junction structure as claimed in claim 9, wherein the metal atoms are selected from the group consisting of Ga, In, Al, Sb, and combinations thereof.

12. A light emitting device comprising:
   a first light emitting structure including a first n-type layer, a first active layer disposed on said first n-type layer, and a first p-type layer disposed on said first active layer opposite to said first n-type layer;
   a second light emitting structure including a second n-type layer, a second active layer disposed on said second n-type layer, and a second p-type layer disposed on said second active layer opposite to said second n-type layer; and
   a multi-layered tunnel junction structure as claimed in claim 1, said multi-layered tunnel junction structure being disposed between said first light emitting structure and said second light emitting structure, an n-type doped insulation layer of said multi-layered tunnel junction structure being disposed adjacent to said first p-type layer of said first light emitting structure, a p-type doped insulation layer of said multi-layered tunnel junction structure being disposed adjacent to said second n-type layer of said second light emitting structure.

13. The light emitting device as claimed in claim 12, further comprising a substrate on which said first light emitting structure is formed.

14. A method for producing a light emitting device, comprising:
   forming a first light emitting structure, the first light emitting structure including a first n-type layer, a first active layer disposed on the first n-type layer, and a first p-type layer disposed on the first active layer opposite to the first n-type layer;
   forming a multi-layered tunnel junction structure as claimed in claim 1 on the first light emitting structure; and
   forming a second light emitting structure on the multi-layered tunnel junction structure opposite to the first light emitting structure, the second light emitting structure including a second n-type layer, a second active layer disposed on the second n-type layer, and a second p-type layer disposed on the second active layer opposite to said second n-type layer,
   wherein an n-type doped insulation layer of the multi-layered tunnel junction structure is disposed adjacent to the first p-type layer of the first light emitting structure, a p-type doped insulation layer of the multi-layered tunnel junction structure being disposed adjacent to the second n-type layer of the second light emitting structure.

15. The method as claimed in claim 14, wherein the first light emitting structure is formed on a substrate.

16. The method as claimed in claim 14, wherein the metal atom layer contains metal atoms obtainable through thermal decomposition.

* * * * *